US012805203B2

(12) United States Patent
Winkler et al.

(10) Patent No.: US 12,805,203 B2
(45) Date of Patent: Nov. 17, 2026

(54) TOPOLOGICAL SUPERCONDUCTOR DEVICES WITH TWO GATE LAYERS

(71) Applicant: Microsoft Technology Licensing, LLC, Redmond, WA (US)

(72) Inventors: Georg Wolfgang Winkler, Santa Barbara, CA (US); Farhad Karimi, Santa Barbara, CA (US); Kevin Alexander Van Hoogdalem, Alphen aan den Rijn (NL); Gijsbertus De Lange, Delft (NL); Jonne Verneri Koski, The Hague (NL); Roman Mykolayovych Lutchyn, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1049 days.

(21) Appl. No.: 17/980,886

(22) Filed: Nov. 4, 2022

(65) Prior Publication Data

US 2024/0074330 A1 Feb. 29, 2024

Related U.S. Application Data

(60) Provisional application No. 63/402,754, filed on Aug. 31, 2022.

(51) Int. Cl.
*H10N 60/10* (2023.01)
*H10N 60/01* (2023.01)

(52) U.S. Cl.
CPC ....... *H10N 60/128* (2023.02); *H10N 60/0884* (2023.02)

(58) Field of Classification Search
CPC .................................................... H10N 60/128
See application file for complete search history.

(56) References Cited

U.S. PATENT DOCUMENTS

2019/0013457 A1 1/2019 Lutchyn et al.
2022/0020914 A1 1/2022 Shabani

FOREIGN PATENT DOCUMENTS

WO 2023284936 A1 1/2023

OTHER PUBLICATIONS

Aghaee M, et al., "InAs-Al Hybrid Devices Passing the Topological Gap Protocol", arxiv.org, Cornell University Library, 201 Olin Library Cornell University Ithaca, NY 14853, Jul. 6, 2022, pp. 1-34.

(Continued)

*Primary Examiner* — Paul A Wartalowicz
(74) *Attorney, Agent, or Firm* — Alleman Hall LLP

(57) ABSTRACT

Topological superconductor devices with gates formed in two gate layers are described. A topological superconductor device includes a superconducting wire having a first junction near a first end of the superconducting wire and a second junction near a second end, opposite to the first end. The topological superconductor device further includes: (1) a first side-plunger gate and a second-side plunger gate formed in a first gate layer of the topological superconductor device, (2) a middle-plunger gate formed in the first gate layer of the topological superconductor device, (3) a first cutter gate formed in a second layer, different from the first layer, of the topological superconductor device, and (4) a second cutter gate formed in the second layer of the topological superconductor device. The plunger gates are operable to tune respective sections of the superconducting wire and the cutter gates are operable to open and close the respective junctions.

20 Claims, 11 Drawing Sheets

100

(56) References Cited

OTHER PUBLICATIONS

Aghaee M, et al., "InAs-AI Hybrid Devices Passing the Topological Gap Protocol", arxiv.org, Cornell University Library, 201 Olin Library Cornell University Ithaca, NY 14853, Mar. 8, 2024, pp. 1-56.
International Search Report and Written Opinion received for PCT Application No. PCT/US2023/028109, Oct. 8, 2024, 18 pages.
Poschl, et al., "Nonlocal Conductance Spectroscopy of Andreev Bound States in Gate-Defined InAs/Al nanowires," arxiv.org, Cornell University Library, 201 Olin Library Cornell University Ithaca, NY 14853, Apr. 5, 2022, pp. 1-23.
Aghaee, et al., "InAs-AI Hybrid Devices Passing the Topological Gap Protocol", In Repository of arXiv:2207.02472v3, Nov. 16, 2022, 49 Pages.
International Preliminary Report on Patentability (Chapter I) received for PCT Application No. PCT/US2023/028109 mailed on Date Mar. 13, 2025, 10 Pages.

100

200

350

400

500

610

620

700

800

900

TOPOLOGICAL SUPERCONDUCTOR DEVICES WITH TWO GATE LAYERS

CROSS-REFERENCE TO A RELATED APPLICATION

This application claims the benefit of U.S. Provisional Application No. 63/402,754, filed Aug. 31, 2022, titled "TOPOLOGICAL SUPERCONDUCTOR DEVICES WITH TWO GATE LAYERS," the entire contents of which are hereby incorporated herein by reference.

BACKGROUND

In certain applications, topological superconductor devices can be used to enable Measurement-based Majorana zero mode (MZM) qubits. Such MZM qubits require the ability to tune portions of a topological superconductor device into the topological phase and open or close tunnel junctions. Conventional topological superconductor devices are fabricated using gates that are formed in a single layer and are used for tuning both the tunnel junctions and the bulk. Such topological superconductor devices can be improved by using gates that are formed in at least two different gate layers as described in the present disclosure.

SUMMARY

Topological superconductor devices with gates formed in two gate layers are described. Such topological superconductor devices may include a superconducting wire (e.g., an aluminum strip) separated from a quantum well in 2-dimensional electron gas (2DEG) by a barrier. Gates are used to deplete the 2DEG except underneath the superconducting wire, thereby creating a nanowire. Additional gates can be used to control the tunnel junctions associated with Majorana zero modes (MZMs).

The use of two gate layers allows one to designate the gate electrodes to perform specific tasks, which in turn minimizes crosstalk among the various gates. As an example, the gates in the first gate layer can control the chemical potential in the wire and the gates in the second gate layer can control the junction with minimal crosstalk between these gate layers. Furthermore, the use of two gate layers permits a junction design that works on multiple material stacks with varying dimensions and is robust to certain misalignment errors. Misalignment can happen between the gate electrodes and the Al strip or between the two gate layers.

In one example, the present disclosure relates to a topological superconductor device comprising a superconducting wire having a first junction near a first end of the superconducting wire and a second junction near a second end, opposite to the first end, of the superconducting wire. The topological superconductor device may further include a first side-plunger gate formed in a first gate layer of the topological superconductor device, where the first side-plunger gate is operable to tune a first section of the superconducting wire located between the first junction and the first end of the superconducting wire. The topological superconductor device may further include a second side-plunger gate formed in the first gate layer of the topological superconductor device, where the second side-plunger gate is operable to tune a second section of the superconducting wire located between the second junction and the second end of the superconducting wire.

The topological superconductor device may further include a middle-plunger gate formed in the first gate layer of the topological superconductor device, where the middle-plunger gate is operable to tune a middle section of the superconducting wire located between the first junction and the second junction. The topological superconductor device may further include a first cutter gate formed in a second layer, different from the first layer, of the topological superconductor device, where the first cutter gate is operable to open and close the first junction. The topological superconductor device may further include a second cutter gate formed in the second layer of the topological superconductor device, where the second cutter gate is operable to open and close the second junction.

In another example, the present disclosure relates to a method for forming a topological superconductor device. The method may include forming a superconducting wire having a first junction near a first end of the superconducting wire and a second junction near a second end, opposite to the first end, of the superconducting wire. The method may further include forming a first side-plunger gate in a first gate layer of the topological superconductor device, where the first side-plunger gate is operable to tune a first section of the superconducting wire located between the first junction and the first end of the superconducting wire. The method may further include forming a second side-plunger gate in the first gate layer of the topological superconductor device, where the second side-plunger gate is operable to tune a second section of the superconducting wire located between the second junction and the second end of the superconducting wire. The method may further include forming a middle-plunger gate in the first gate layer of the topological superconductor device, where the middle-plunger gate is operable to tune a middle section of the superconducting wire located between the first junction and the second junction.

The method may further include forming a first cutter gate in a second layer, different from the first layer, of the topological superconductor device, where the first cutter gate is operable to open and close the first junction. The method may further include forming a second cutter gate in the second layer of the topological superconductor device, where the second cutter gate is operable to open and close the second junction.

In a yet another example, the present disclosure relates to a topological superconductor device comprising a superconducting wire having a first junction near a first end of the superconducting wire and a second junction near a second end, opposite to the first end, of the superconducting wire, where the superconducting wire is patterned on a two-dimensional electron gas (2DEG). The topological superconductor device may further include a left-plunger gate formed in a first gate layer of the topological superconductor device, where the left-plunger gate is operable to tune a first section of the superconducting wire located between the first junction and the first end of the superconducting wire. The topological superconductor device may further include a right-plunger gate formed in the first gate layer of the topological superconductor device, where the right-plunger gate is operable to tune a second section of the superconducting wire located between the second junction and the second end of the superconducting wire. The topological superconductor device may further include a middle-plunger gate formed in the first gate layer of the topological superconductor device, where the middle-plunger gate is operable to tune a middle section of the superconducting wire located between the first junction and the second junction.

The topological superconductor device may further include a left-cutter gate formed in a second layer, different from the first layer, of the topological superconductor device, where the left-cutter gate is operable to open and close the first junction. The topological superconductor device may further include a right-cutter gate formed in the second layer of the topological superconductor device, where the right-cutter gate is operable to open and close the second junction. The topological superconductor device may further include a first helper gate formed in the first layer of the topological superconductor device, where the first helper gate is operable to control a density of electrons in a first region of the 2DEG. The topological superconductor device may further include a second helper gate formed in the first layer of the topological superconductor device, where the second helper gate is operable to control a density of electrons in a second region, different from the first region, of the 2DEG.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated byway of example and is not limited by the accompanying figures, in which like references indicate similar elements. Elements in the figures are illustrated for simplicity and clarity and have not necessarily been drawn to scale.

DETAILED DESCRIPTION

Figure 1:
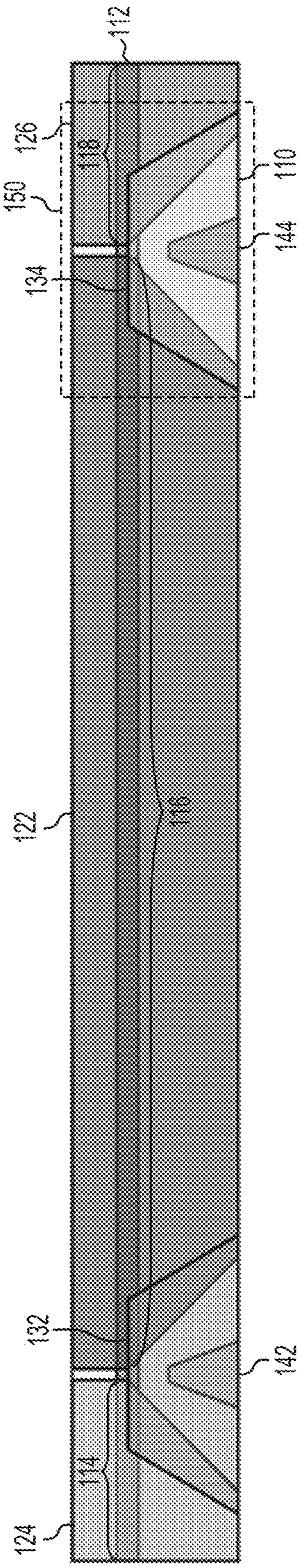
FIG. 1 shows a top view of a topological superconductor device in accordance with one example.

Examples described in this disclosure relate to topological superconductor devices formed using two gate layers. Topological superconductor devices can be used to enable quantum computers. Such quantum computers require reliable reproduction of a stable topological phase of matter that supports non-Abelian quasiparticles or defects and processes quantum information through protected operations, such as braiding.

Certain topological superconductor devices can be used to support two phases-one trivial and the other topological. As used herein, the terms topological and trivial refer to the phase of the superconductor sections that are tuned using electrostatic gates to form topological or trivial superconducting sections. The present disclosure relates to topological superconductor devices that allow one to measure a topological phase transition in a 2-dimensional electron gas (2DEG) nanowire device with a single or multiple occupied sub-bands and normal-superconducting (NS) junctions for probing the device from the sides. As an example, the wire is defined by the combination of a narrow superconducting strip and two layers of gate electrodes. The first (bottom) gate layer partly overlaps with the strip on either side. These gate electrodes deplete the surrounding 2DEG, confining the strip in a channel under the superconductor and controlling the chemical potential in the nanowire. The superconducting strip (partly) screens the electric fields from the gate electrodes defining a wire. In addition, the gate electrodes in the first layer may be used to define normal leads. At the same time, the superconducting strip induces superconductivity via the proximity effect. Moreover, the gate electrodes in the first layer may be used to define the normal leads which can probe the topological phase. The second (top) gate layer opens and closes the junction and optionally controls the chemical potential in the attached quantum dots. The two gate layers are separated by a dielectric. The device can then be used, among other things, to create a Majorana zero mode-based quantum computer having qubits.

Majorana zero mode (MZM) qubits require rapidly configuring couplings between different pairs of MZMs for qubit operations and measurement. As used herein, the term qubit refers to any quantum system that can be in a superposition of two quantum states, 0 and 1. Consistent with the present disclosure, topological superconductor devices formed from a single superconducting wire patterned on a two-dimensional electron gas (2DEG) are described. Different segments of the wire can be tuned using electrostatic gates to form trivial or topological superconducting sections, with Majorana zero modes at their interface. These gates can also be used to control the density in the 2DEG to deplete certain sections and define semiconducting regions that can form tunnel junctions. Each qubit may store information in either four or six Majorana zero modes (MZMs) and can be measured in any Pauli basis.

FIG. 1 shows a top view of a topological superconductor device 100 in accordance with one example. The top view is shown in shades of gray with transparent layering to describe the various aspects of topological superconductor device 100. Topological superconductor device 100 may include a superconducting wire 112 formed on a two-dimensional electron gas (2DEG) 110. Superconducting wire 112 may be formed as a single nanowire. As an example, superconducting wire 112 may be formed as a semiconductor wire (e.g., indium arsenide (InAs)) coated by a superconductor (e.g., aluminum (Al)). Sections of superconducting wire 112 can be configured into the topological phase or the trivial phase. As an example, superconducting wire sections 114 and 118 may be configured into the trivial phase. Superconducting wire section 116 may be configured into the topological phase. In one example, the terms topological and trivial refer to the phase of the superconductor sections that are tuned using electrostatic gates to form topological or trivial superconducting sections.

With continued reference to FIG. 1, topological superconductor device 100 may further include a middle-plunger gate 122, a side-plunger gate 124, another side-plunger gate 126, a cutter gate 132, another cutter gate 134, a helper gate 142, and another helper gate 144. Each of the plunger gates can be used to deplete the 2DEG. Once the 2DEG has been depleted, the plunger gates may be operated at even more negative voltages to tune the electrochemical potential, and therefore, the density underneath the wire. In one example, middle-plunger gate 122 may be used to control the density in the middle section (e.g., section 116) of superconducting wire 112, side-plunger gate 124 may be used to control the density in the left section (e.g., section 114) of superconducting wire 112, and side-plunger gate 126 may be used to control the density in the right section (e.g., section 118) of superconducting wire 112. Middle-plunger gate 122 may also be used to tune the density of the wire to the topological regime.

Still referring to FIG. 1, cutter gate 132 and cutter gate 134 may be used to open and close the two junctions formed in superconducting wire 112. One junction may be formed near a first end of superconducting wire 112 and the other junction may be formed near a second end, opposite to the first end, of superconducting wire 112. As used herein, the term "near" is used to generally identify the relative locations of the two junctions with respect to the opposite ends of the superconducting wire. As such, the specific location of the two junctions is determined by the location of the gates since the gates control the conductivity of the various regions of the 2DEG underlying the superconducting wire. As an example, the first junction may be formed in a region between middle-plunger gate 122 and side-plunger gate 124 and the second junction may be formed in a region between middle-plunger gate 122 and side-plunger gate 126. In addition, the junctions may be connected via conducting paths (e.g., semiconducting regions) in the 2DEG to other Ohmic contacts. Helper gates 142 and 144 may be used to increase the electron density in the junctions and leads, the latter of which may be connected to measurement circuits. As an example, helper gates 142 and 144 may also help define conducting paths by accumulating carrier density in the 2DEG underneath them and keeping such areas conductive.

The plunger gates, the cutter gates, and the helper gates described herein may be supplied voltages via voltage waveforms generated by a control system (not shown) associated with the topological superconductor device 100 of FIG. 1. Such a control system may include an oscillator, switches, finite state machines, and a memory. As an example, the memory may be implemented as one or more multi-bit registers for allowing pulse-patterns to be stored.

Figure 2:
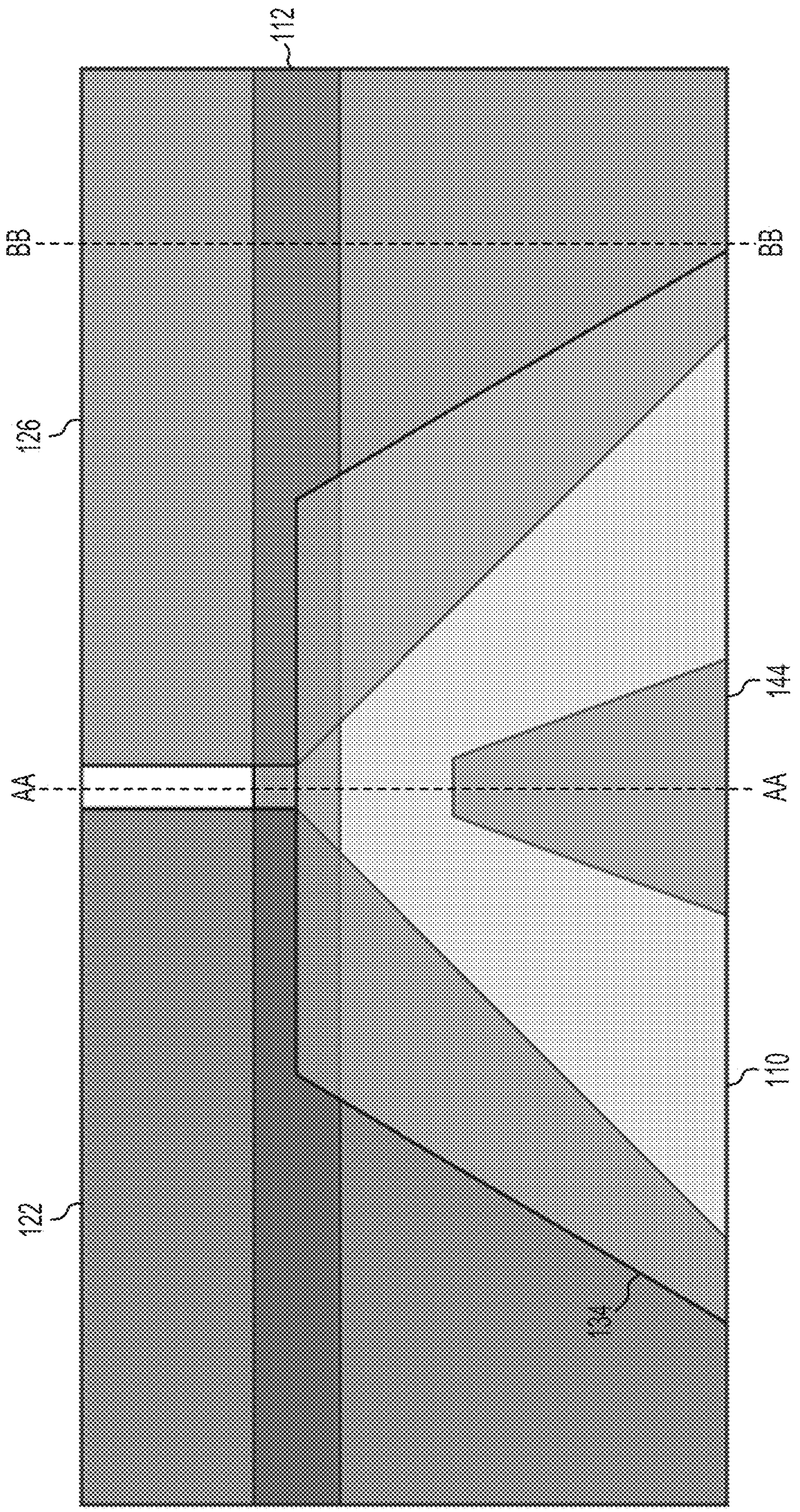
FIG. 2 shows an expanded view of a portion of the topological superconductor device of FIG. 1.
Figure 3A:
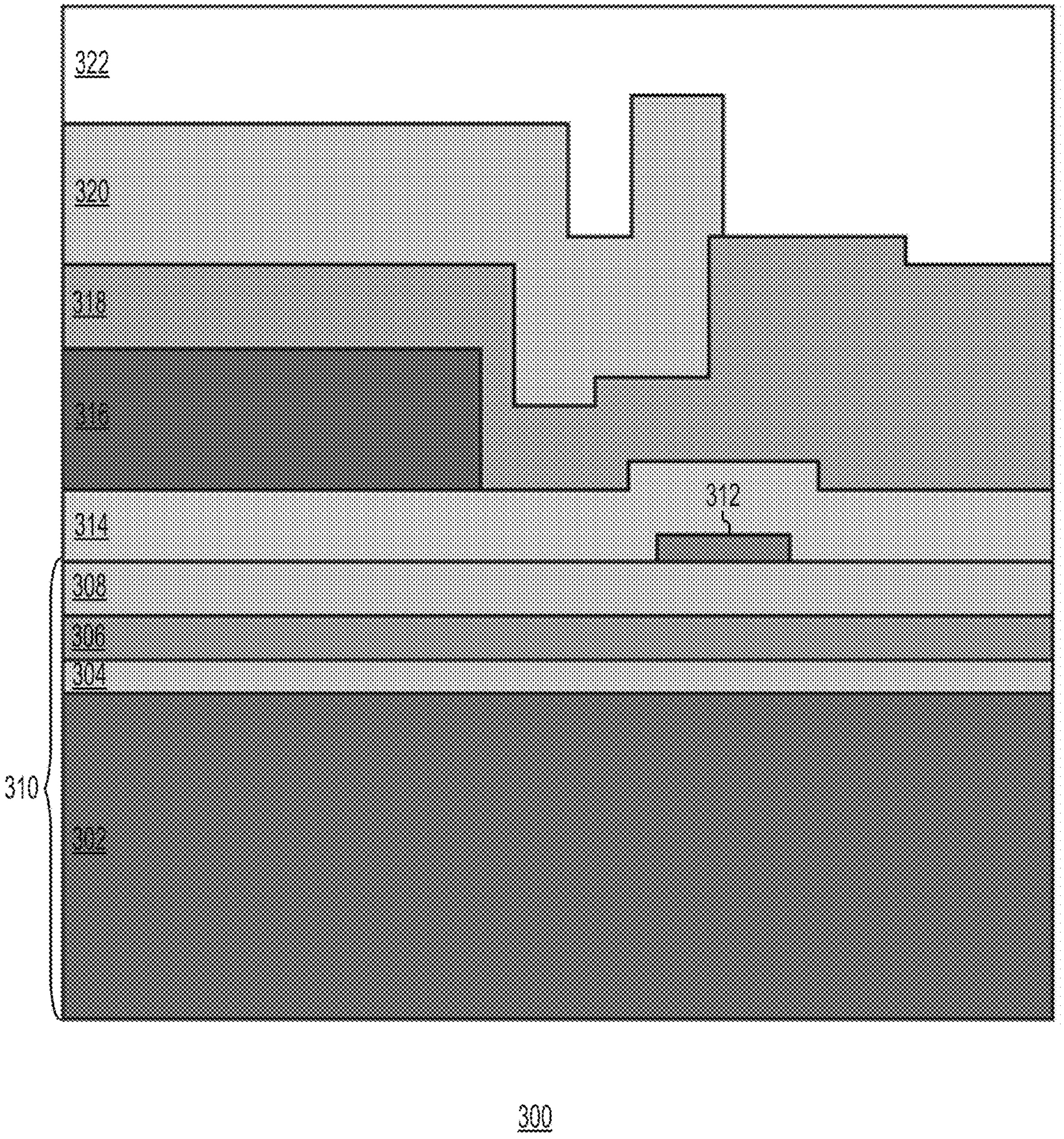
FIG. 3A shows a cross-section view of the topological superconductor device of FIG. 1 in relation to the expanded view of FIG. 2.
Figure 3B:
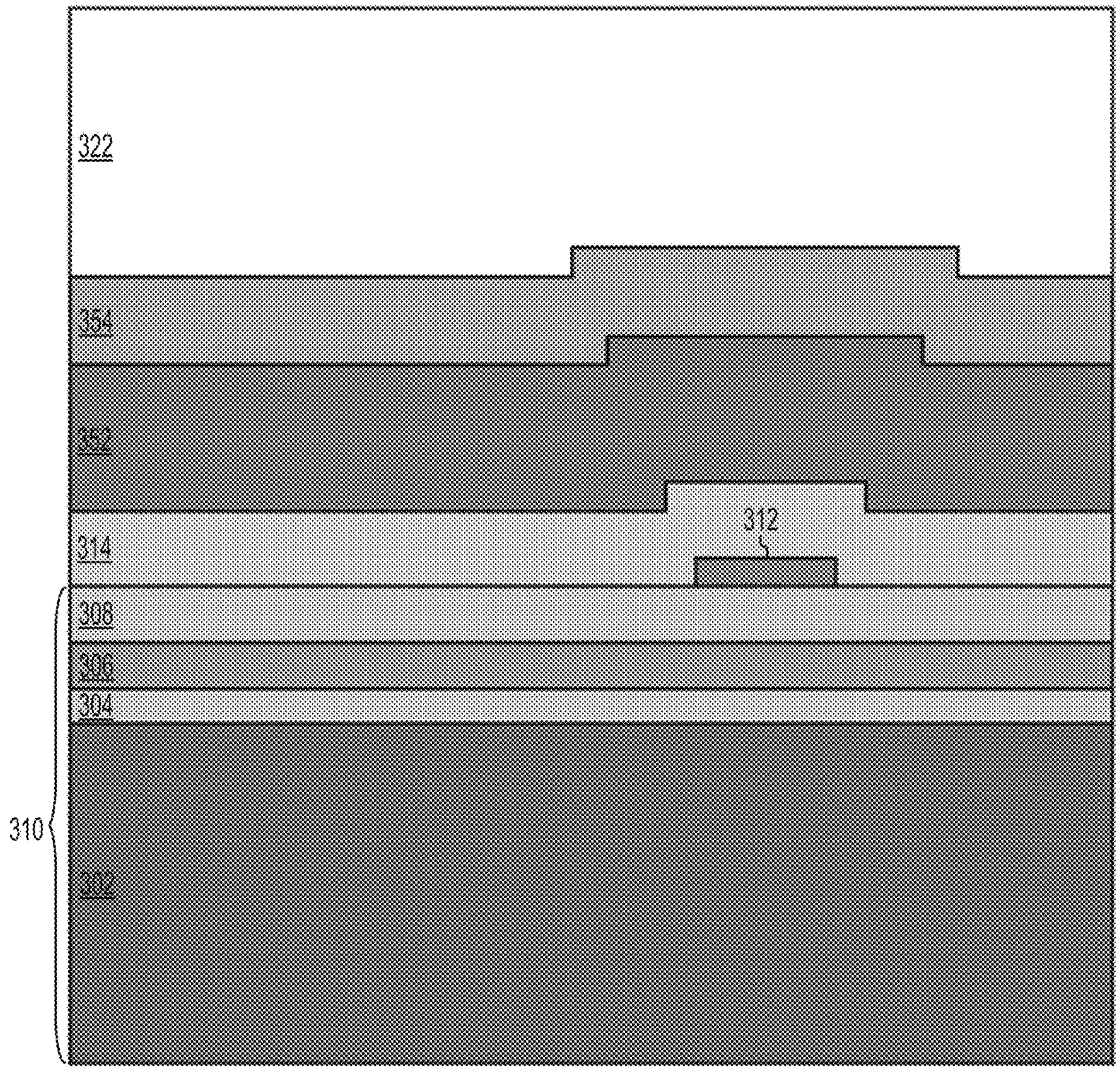
FIG. 3B shows another cross-section view of the topological superconductor device of FIG. 1 in relation to the expanded view of FIG. 2.
Figure 4:
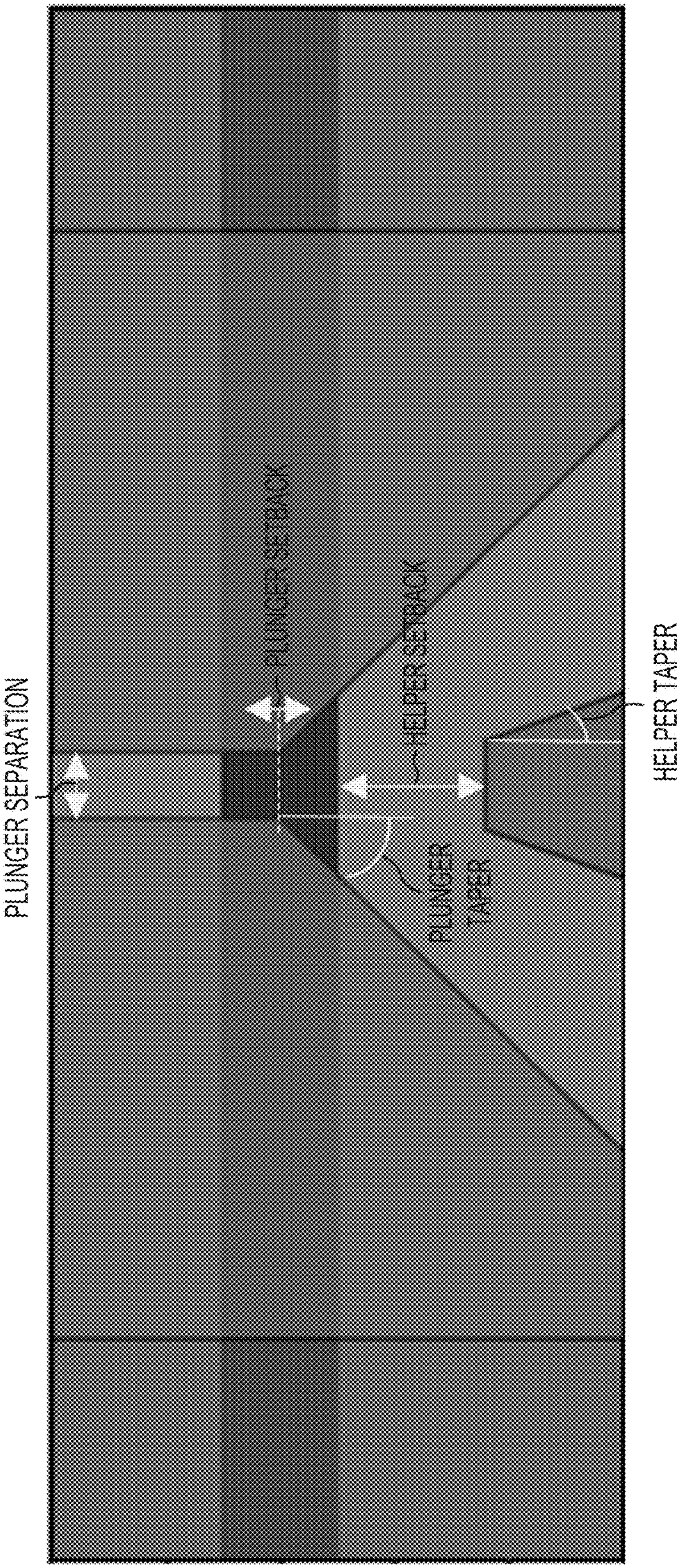
FIG. 4 shows design optimization parameters associated with the topological superconductor device of FIG. 1.

As described further with respect to FIGS. 2-4, in one example, middle-plunger gate 122, side-plunger gate 124, side-plunger gate 126, and helper gates 142 and 144 may be formed as part of a first gate layer. In addition, as described further with respect to FIGS. 2-4, in one example, cutter gate 132 and cutter gate 134 may be formed as part of a second gate layer, different from the first gate layer. In one example, the 2DEG underlying the gates may be manufactured by forming a series of layers of semiconductors on a substrate (e.g., using any of indium phosphide (InP) substrate, indium arsenide (InAs), indium antimonide (InSb), mercury cadmium telluride (HgCdTe), or any appropriate combination of materials selected from groups II, III, IV, V, or VI of the periodic table, or any ternary compounds of three different atoms of materials selected from groups II, III, IV, V, or VI of the periodic table). As an example, the 2DEG may further include a buffer layer (e.g., an indium aluminum arsenide (InAlAs) layer) formed over the substrate. The 2DEG may further include a quantum well layer (e.g., an indium arsenide (InAs) layer) formed over the buffer layer, and a barrier layer formed over the quantum well layer. Each of these layers may be formed using molecular-beam epitaxy (MBE). As an example, the MBE related process may be performed in an MBE system that allows the deposition of the appropriate materials in a vacuum. Topologically active areas may be defined by depositing a metal layer (e.g., aluminum (Al)). A portion 150 of topological superconductor device 100 delineated by the dotted box is further described with respect to FIG. 2. Although FIG. 1 shows a certain gate configuration corresponding to topological superconductor device 100 of FIG. 1, other gate configurations may also be used to implement the functionality of topological superconductor device 100 of FIG. 1.

FIG. 2 shows an expanded view 200 of the portion 150 of topological superconductor device 100 of FIG. 1. Unless labeled otherwise, the expanded view 200 of the portion 150 uses the same reference numerals as used for FIG. 1 to identify same, or portions of the same, structures of topological superconductor device 100 of FIG. 1. Such structures are not described again with respect to FIG. 2. To further explain the gates formed in two different layers of topological superconductor device 100 of FIG. 1, two cross-section views (a cross-section view along dotted line AA and another cross-section view along dotted line BB) in relation to FIG. 2 are described with respect to FIG. 3A and FIG. 3B, respectively.

FIG. 3A shows a cross-section view 300 of topological superconductor device 100 of FIG. 1 taken along dotted line A-A in relation to the expanded view of FIG. 2. Topological superconductor device 100 may include a buffer layer 304 formed over a substrate 302. Topological superconductor device 100 may further include a quantum well layer 306 formed over buffer layer 304. Topological superconductor device 100 may further include a barrier layer 308 formed over quantum well layer 306. Barrier layer 308 may not be necessary to complete the formation of certain types of quantum wells. In this example, substrate 302 may be an indium phosphide (InP) substrate. Buffer layer 304 may be an indium gallium arsenide (InGaAs) layer. Quantum well layer 306 may be an indium arsenide (InAs) layer. Barrier layer 308 may be an indium aluminum arsenide (InAlAs) layer. The combination of substrate 302, buffer layer 304, quantum well layer 306, and barrier layer 308 may be referred to as 2DEG 310. Each of these layers may be formed using molecular-beam epitaxy (MBE). As an example, the MBE related process may be performed in an MBE system that allows the deposition of the appropriate materials in a vacuum.

With continued reference to FIG. 3A, a cross-section of superconducting wire 312 (corresponding to superconducting wire 112 of FIG. 1) is shown as part of topological superconductor device 100. A dielectric layer 314 is shown as formed adjacent to and above superconducting wire 312. In one example, superconducting wire 312 may be an aluminum wire that may be formed by first forming an aluminum layer over barrier layer 308, forming a dielectric over the aluminum layer, and then selectively etching the dielectric to form topologically active areas. Dielectric layer 314 may be formed as an oxide layer (e.g., hafnium oxide or aluminum oxide) or using another appropriate dielectric layer material. Cross-section view 300 further shows a helper gate 316 (corresponding to helper gate 144 of FIG. 1) formed over dielectric layer 314. Thus, helper gate 316 may be formed in a first layer of gates included in topological superconductor device 100. Helper gate 316 may be formed of gold (Au) or a titanium-gold (Ti—Au) alloy. Another dielectric layer 318 is shown as formed over helper gate 316. Dielectric layer 318 may also be formed as an oxide layer (e.g., hafnium oxide or aluminum oxide) or using another appropriate dielectric layer material. Cross-section view 300 further shows a cutter gate 320 (corresponding to gate 134 of FIG. 1) formed over dielectric layer 318. Thus, cutter gate 320 may be formed in a second layer of gates, different from the first layer of gates, included in topological superconductor device 100. Cutter gate 320 may also be formed of gold (Au) or a titanium-gold (Ti—Au) alloy. Finally, a capping layer 322 is shown as formed over cutter gate 320. Capping layer 322 may also be formed as an oxide layer (e.g., hafnium oxide or aluminum oxide) or using another appropriate dielectric layer material. Although cross-section view 300 of FIG. 3A shows a certain number of layers arranged in a certain order, topological superconductor device 100 of FIG. 1 may include additional or fewer layers, arranged differently.

FIG. 3B shows another cross-section view 350 of the topological superconductor device 100 of FIG. 1 taken along dotted line B-B in relation to the expanded view of FIG. 2. Unless labeled otherwise, cross-section view 350 uses the same reference numerals as used for cross-section view 300 of FIG. 3A to identify the same, or portions of the same, layers of topological superconductor device 100 of FIG. 1. Such layers are not described again with respect to FIG. 3B. Cross-section view 350 further shows a middle-plunger gate 352 (corresponding to mid-plunger gate 126 of FIG. 1) formed over dielectric layer 314. Thus, middle-plunger gate 352 may be formed in a first layer of gates included in topological superconductor device 100. Middle-plunger gate 352 may be formed of gold (Au) or a titanium-gold (Ti—Au) alloy. Another dielectric layer 354 is shown as formed over middle-plunger gate 352. Dielectric layer 354 may also be formed as an oxide layer (e.g., hafnium oxide or aluminum oxide) or using another appropriate dielectric layer material. Although cross-section view 350 of FIG. 3B shows a certain number of layers arranged in a certain order, topological superconductor device 100 of FIG. 1 may include additional or fewer layers, arranged differently.

FIG. 4 shows design optimization parameters associated with the topological superconductor device 100 of FIG. 1. As explained earlier, the design of topological superconductor device 100 includes several different structures, including various types of gates, that are formed in two different layers. As an example, in order to operate the topological superconductor device with a superconducting wire, formed on a 2DEG, several gates may be used, including a middle-plunger gate, a side-plunger gate, another side-plunger gate, a cutter gate, and another cutter gate, a helper gate, and another helper gate. The structure and functions of these gates are described earlier with respect to FIGS. 1, 2, 3A, and 3B. FIG. 4 shows a detailed view 400 including examples of design parameters, such as plunger separation, plunger setback, plunger taper, helper setback, and helper taper. Plunger separation relates to the amount of separation between two plunger gates (e.g., between the middle-plunger gate 122 and side-plunger gate 126 of FIG. 1). In a topological superconductor device that has gates formed in only one layer, the plunger gates need to be set back from the cutter gates. Plunger setback relates to the separation between the plunger gates and the cutter gates assuming these two gates were formed in the same layer. However, since topological superconductor device 100 of FIG. 1 has the plunger gates formed in a different layer from the cutter gates, the plunger setback can effectively be zero. Plunger taper relates to the angle of taper for the plunger gates, such as middle-plunger gate 122 of FIG. 1 and the two side-plunger gates. Helper setback relates to the amount of separation between the superconducting wire and the helper gate (e.g., helper gate 144 of FIG. 1). Helper taper relates to the angle of taper of the helper gates, such as helper gate 144 of FIG. 1. Each of these design parameters can be selected to optimize the performance of the topological superconductor device.

Figure 5:
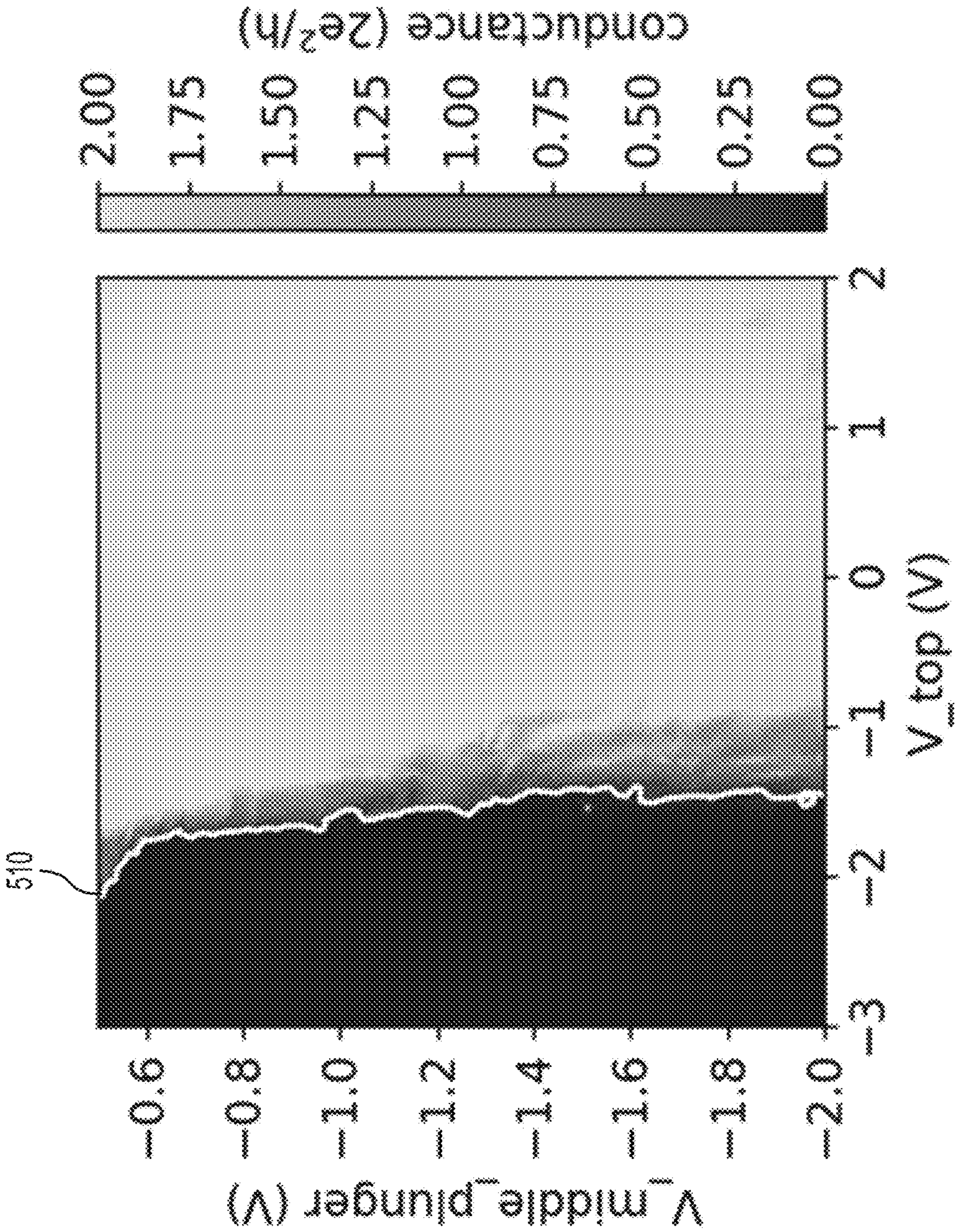
FIG. 5 shows local conductance measurements for the topological superconductor device of FIG. 1 to illustrate the benefits of the design of this device.

The use of gates that are formed in two different layers of the topological superconductor device creates several benefits. First, the crosstalk among gates is reduced because certain gates are formed in one layer of the topological superconductor device while certain other gates are formed in a different layer of the topological superconductor device. As an example, FIG. 5 shows a simulation-based graph 500 of local conductance values of a junction in relation to voltages applied to the cutter gate and the middle-plunger gate. In graph 500, the voltage applied to the cutter gate is labeled as V_top, the voltage applied to the middle-plunger gate is labeled as V_middle_plunger, and the conductance values are labeled as conductance ($2e^2/h$). Line 510 indicates the region of graph 500 around which the local conductance values indicate that the junction is conducting at a certain level (e.g., $0.8e^2/h$ in this simulation). As shown by the relative straightness of line 510 in FIG. 5, there is negligible crosstalk between the cutter gate and the middle-plunger gate regardless of the combination of voltages being applied to these gates. In addition, line 510 is almost vertical because the value of the voltage (V_top) applied to the cutter gate voltage is only weakly dependent upon the value of the voltage (V_middle_plunger) applied to the middle-plunger gate, which further illustrates the negligible crosstalk between the cutter gate and the middle-plunger gate.

Second, the optimization of the design parameters for the topological superconductor device ensures that there are no wire regions with unwanted resonances. In other words, there is a smooth monotonic response of the local conductance to the gate voltages.

Figure 6A:
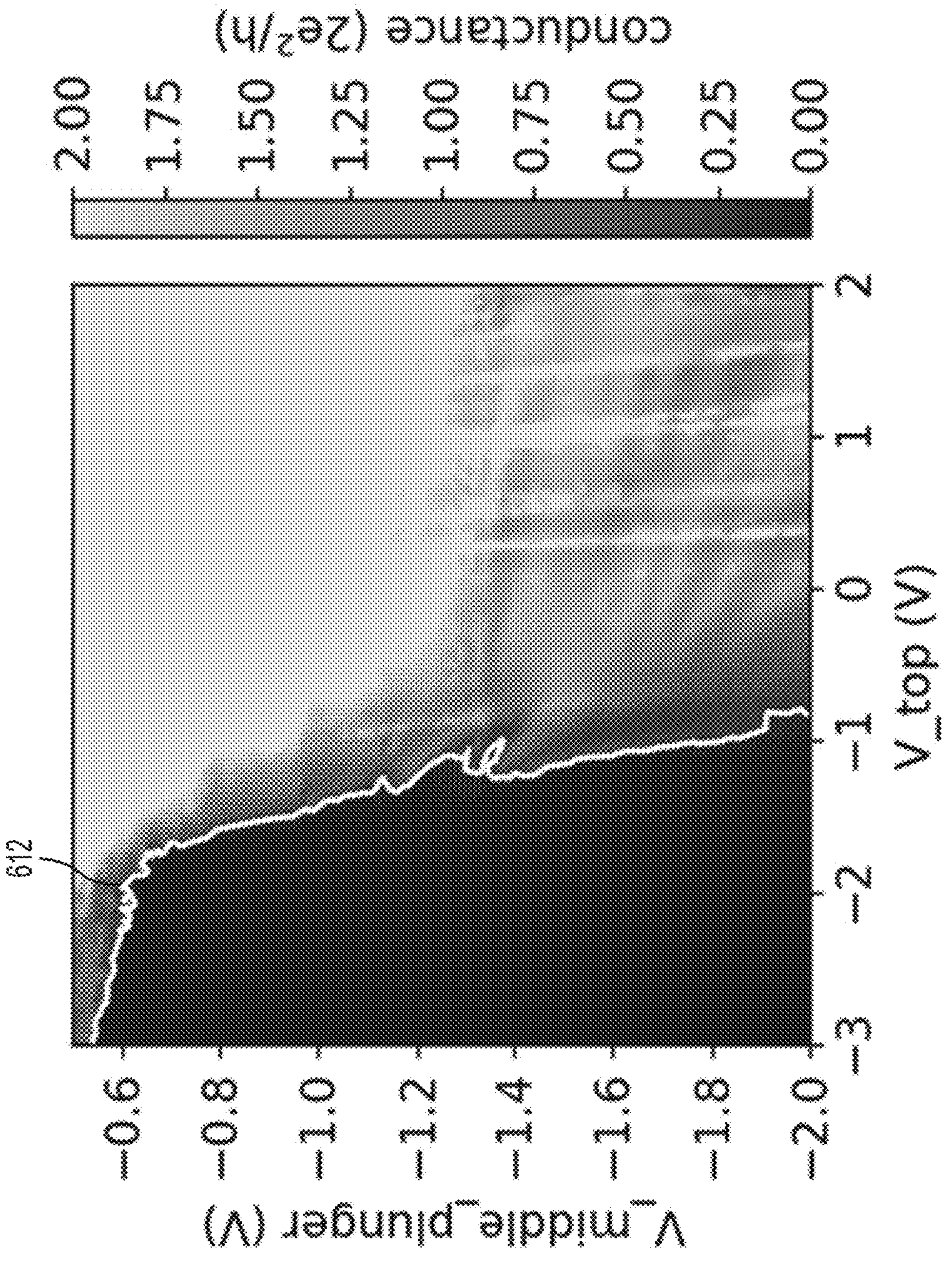
FIGS. 6A and 6B show local conductance measurements for the topological superconductor device of FIG. 1 to illustrate the robustness of the design to alignment errors.
Figure 6B:
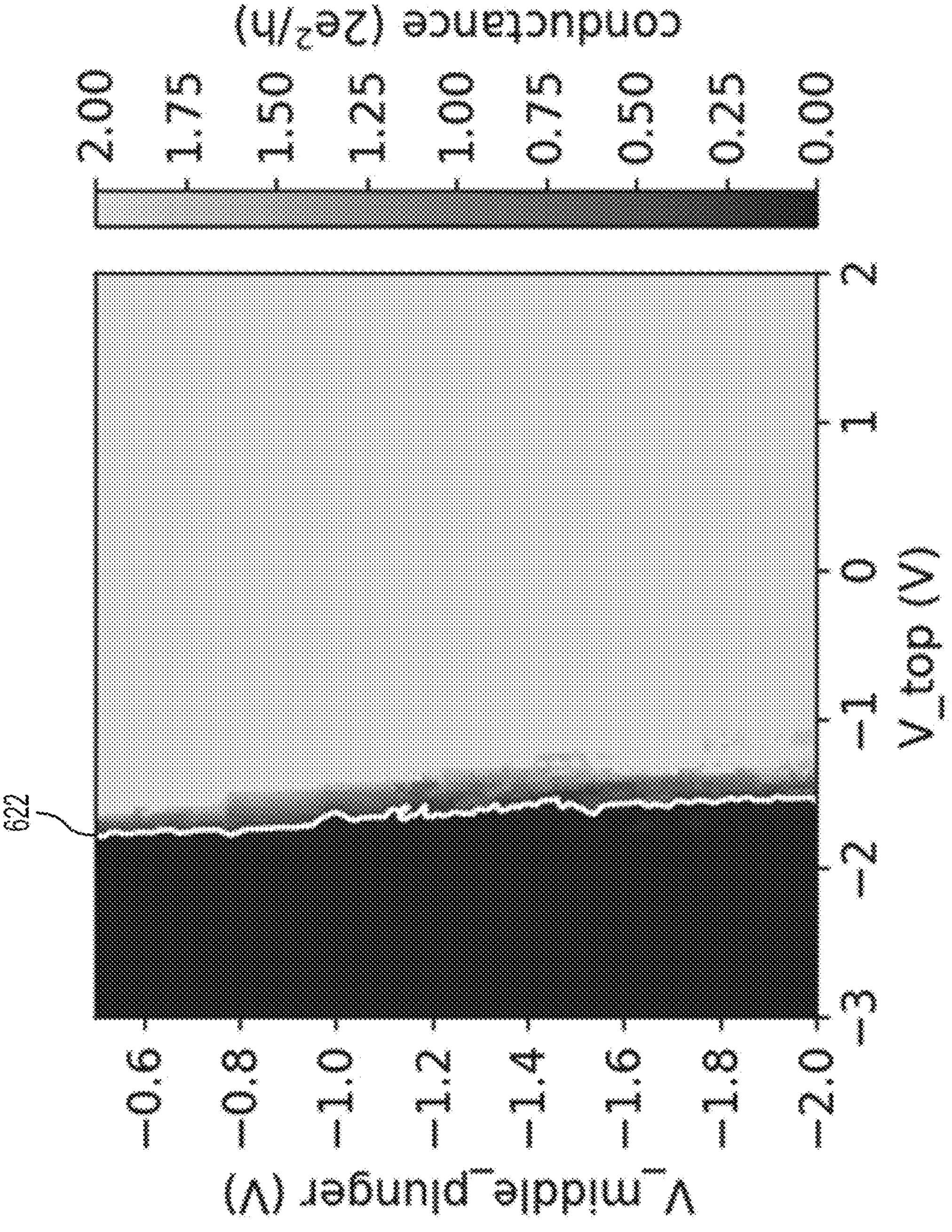

A third benefit of the use of gates that are formed in two different layers of the topological superconductor device is the robustness of this design to misalignment among structures during fabrication. Specifically, the misalignment of the plunger gates relative to the superconducting wire. As an example, FIG. 6A and FIG. 6B show local conductance measurements for topological superconductor device 100 of FIG. 1 with different amounts of misalignment to illustrate the robustness of the design to alignment errors. FIG. 6A shows a simulation-based graph 610 of local conductance values of a junction in relation to voltages applied to the cutter gate and the middle-plunger gate based on a simulation in which the plunger gates are shifted up by 20 nm relative to the superconducting wire. FIG. 6B shows a simulation-based graph 620 of local conductance values of a junction in relation to voltages applied to the cutter gate and the middle-plunger gate based on a simulation in which the plunger gates are shifted down by 20 nm relative to the superconducting wire. In other words, graph 610 relates to a topological superconductor device with a misalignment in one direction relative to a design and graph 620 relates to another topological superconductor device with a misalignment in the opposite direction relative to the same design. In each of graphs 610 and 620, the voltage applied to the cutter gate is labeled as V_top, the voltage applied to the middle-plunger gate is labeled as V_middle_plunger, and the conductance values are labeled as conductance ($2e^2/h$). Line 612 indicates the region of graph 610 around which the local conductance values indicate that the junction is conducting at a certain level. Line 622 indicates the region of graph 620 around which the local conductance values indicate that the junction is conducting at a certain level. As shown by these graphs, the topological superconductor device is robust to misalignment errors.

Figure 7:
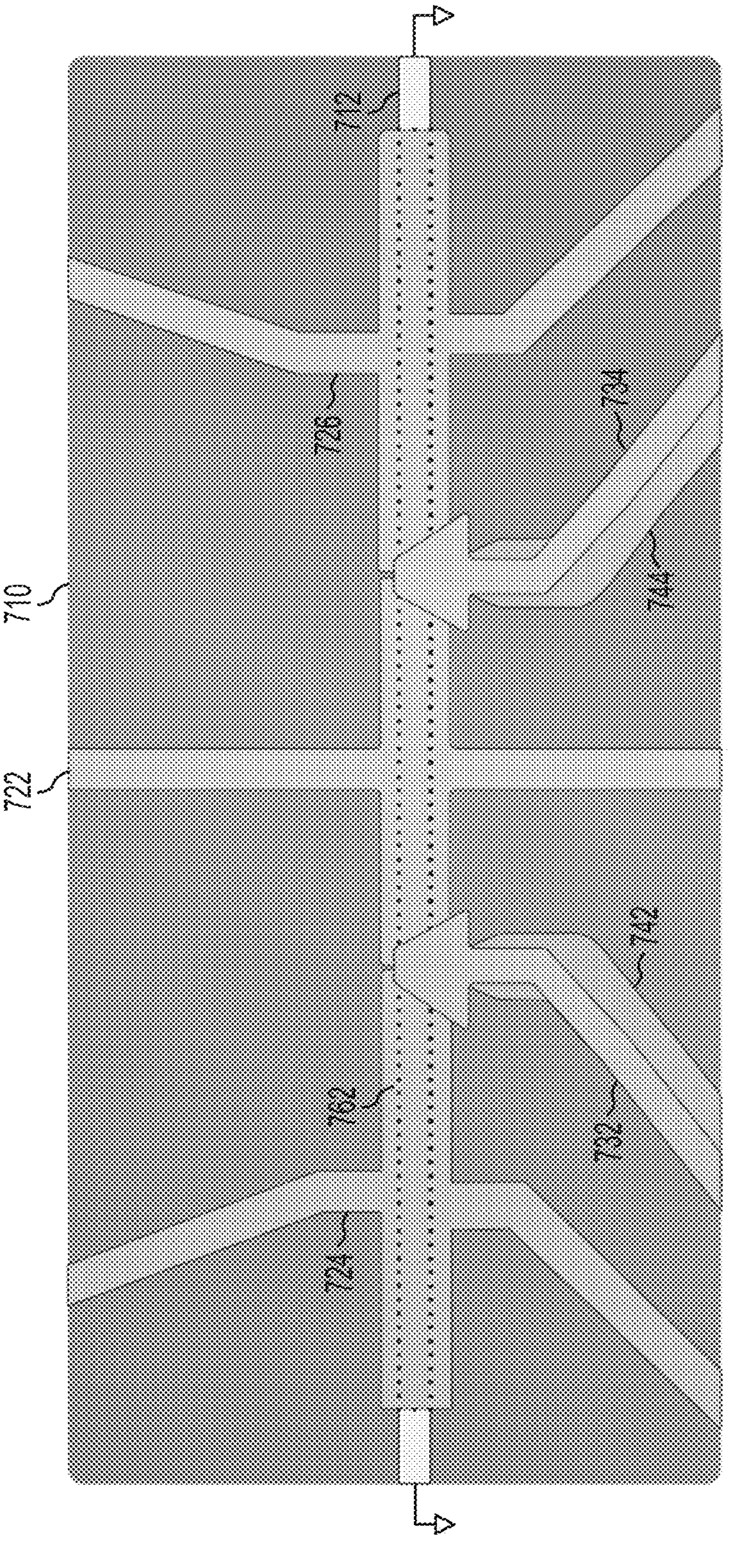
FIG. 7 shows a top view of another topological superconductor device in accordance with one example.

FIG. 7 shows a top view of another topological superconductor device 700 in accordance with one example. The top view is shown in shades of gray with transparent layering to describe the various aspects of topological superconductor device 700. Topological superconductor device 700 may include a superconducting wire 712 formed on a two-dimensional electron gas (2DEG) 710. Superconducting wire 712 may be formed as a single nanowire. As an example, superconducting wire 712 may be formed as a semiconductor wire (e.g., indium arsenide (InAs)) coated by a superconductor (e.g., aluminum (Al)). Sections of superconducting wire 712 can be configured into the topological phase or the trivial phase. As before, in this example also, the terms topological and trivial refer to the phase of the superconductor sections that are tuned using electrostatic gates to form topological or trivial superconducting sections.

With continued reference to FIG. 7, topological superconductor device 700 may further include a middle-plunger gate 722, a left-plunger gate 724, right-plunger gate 726, a left-cutter gate 732, a right-cutter gate 734, a helper gate 742, and another helper gate 744. Each of the plunger gates can be used to deplete the 2DEG. Once the 2DEG has been depleted, the plunger gates may be operated at even more negative voltages to tune the electrochemical potential, and therefore, the density underneath the wire. In one example, middle-plunger gate 722 may be used to control the density in the middle section of superconducting wire 712, left-plunger gate 724 may be used to control the density in the left section of superconducting wire 712, and right-plunger gate 726 may be used to control the density in the right section of superconducting wire 712. Middle-plunger gate 722 may also be used to tune the density of the wire to the topological regime. Thus, in this example, the plunger gates serve to deplete the 2DEG in the InAs quantum well to define a high-quality one-dimensional conducting channel and to tune the density in the corresponding sections of the device.

Still referring to FIG. 7, left-cutter gate 732 and right-cutter gate 734 may be used to open and close the two junctions formed in superconducting wire 712. One junction may be formed near a first end of superconducting wire 712 and the other junction may be formed near a second end, opposite to the first end, of superconducting wire 712. As used herein, the term "near" is used to generally identify the relative locations of the two junctions with respect to the opposite ends of the superconducting wire. As such, the specific location of the two junctions is determined by the location of the gates since the gates control the conductivity of the various regions of the 2DEG underlying the superconducting wire. As an example, the first junction may be formed in a region between middle-plunger gate 722 and left-plunger gate 724 and the second junction may be formed in a region between middle-plunger gate 722 and right-plunger gate 726. In addition, the junctions may be connected via conducting paths (e.g., semiconducting regions) in the 2DEG to other Ohmic contacts. Helper gates 742 and 744 may be used to increase the electron density in the junctions and leads, the latter of which may be connected to measurement circuits. As an example, helper gates 742 and 744 may also help define conducting paths by accumulating carrier density in the 2DEG underneath them and keeping such areas conductive. In sum, the combination of the gates formed in the two different layers may be used to manage active region 762.

Like as described with respect to topological superconductor device 100 of FIG. 1, the plunger gates, the cutter gates, and the helper gates associated with topological superconductor device 700 may be supplied voltages via voltage waveforms generated by a control system (not shown) associated with the topological superconductor device 700 of FIG. 7. Such a control system may include an oscillator, switches, finite state machines, and a memory. As an example, the memory may be implemented as one or more multi-bit registers for allowing pulse-patterns to be stored.

Figure 8:
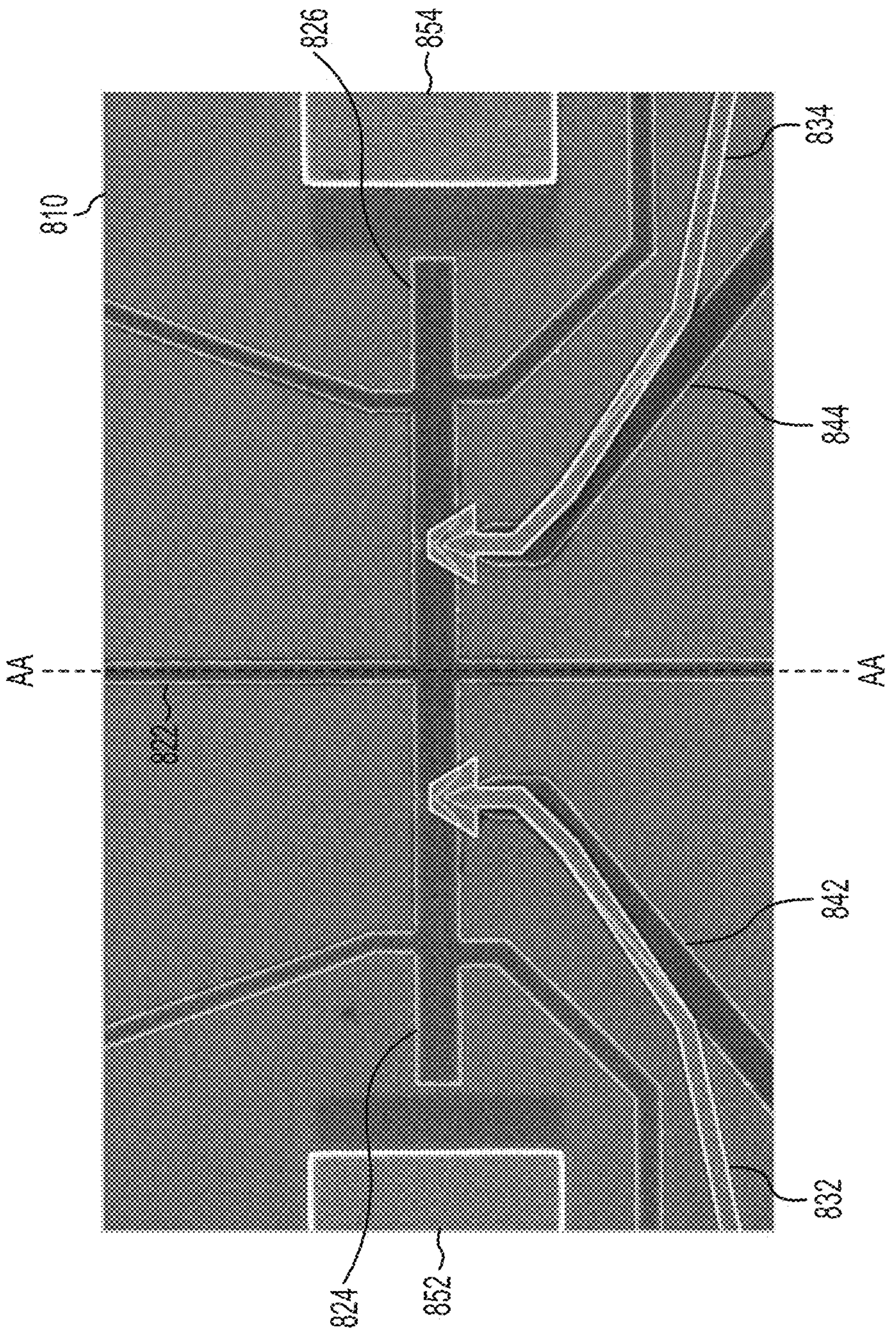
FIG. 8 shows a scanning-electron-microscope (SEM) image of a portion of the topological superconductor device of FIG. 7.

FIG. 8 shows a scanning-electron-microscope (SEM) image 800 of a portion of the topological superconductor device 700 of FIG. 7. SEM image 800 shows structures of topological superconductor device 700 of FIG. 7 that are visible when scanned using a scanning electron microscope. SEM image 800 does not show the superconducting wire (e.g., similar to superconducting wire 712 of FIG. 1) formed on a 2DEG 810. As explained earlier with respect to FIG. 7, topological superconductor device 700 may further include several gates. SEM image 800 shows a middle-plunger gate 822, a left-plunger gate 824, a right-plunger gate 826, a left-cutter gate 832, a right-cutter gate 834, a helper gate 842, and another helper gate 844. SEM image 800 further shows ohmic contacts 852 and 854 that are used to ground each end of the superconducting wire.

Figure 9:
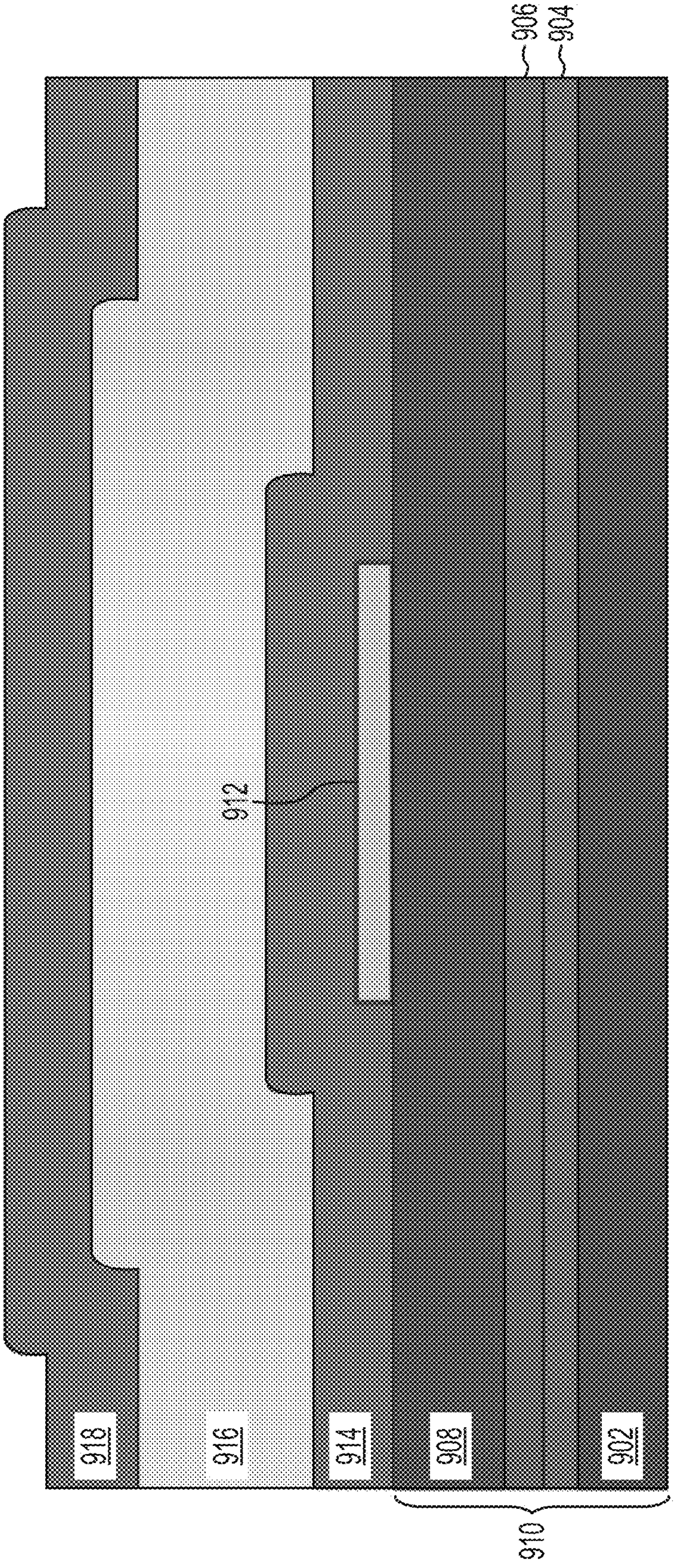
FIG. 9 shows a cross-section view of the topological superconductor device of FIG. 7.

FIG. 9 shows a cross-section view 900 of the topological superconductor device 700 of FIG. 7 taken along line AA-AA in relation to SEM image 800 of FIG. 8. Like topological superconductor device 100 of FIG. 1, topological superconductor device 700 may include a buffer layer 904 formed over a substrate 902. Topological superconductor device 700 may further include a quantum well layer 906 formed over buffer layer 904. Topological superconductor device 700 may further include a barrier layer 908 formed over quantum well layer 906. Barrier layer 908 may not be necessary to complete the formation of certain types of quantum wells. In this example, substrate 902 may be an indium phosphide (InP) substrate. Buffer layer 904 may be an indium gallium arsenide (InGaAs) layer. Quantum well layer 906 may be an indium arsenide (InAs) layer. Barrier layer 908 may be an indium aluminum arsenide (InAlAs) layer. As noted earlier, the combination of substrate 902, buffer layer 904, quantum well layer 906, and barrier layer 908 may be referred to as 2DEG 910. Each of these layers may be formed using molecular-beam epitaxy (MBE). As an example, the MBE related process may be performed in an MBE system that allows the deposition of the appropriate materials in a vacuum.

With continued reference to FIG. 9, a cross-section of superconducting wire 912 (corresponding to superconducting wire 712 of FIG. 7) is shown as part of topological superconductor device 700. A dielectric layer 914 is shown as formed above superconducting wire 912. In one example, superconducting wire 912 may be an aluminum wire that may be formed by first forming an aluminum layer over barrier layer 908, forming a dielectric over the aluminum layer, and then selectively etching the dielectric to form topologically active areas. Dielectric layer 914 may be formed as an oxide layer (e.g., hafnium oxide or aluminum oxide) or using another appropriate dielectric layer material. Cross-section view 900 further shows a middle-plunger gate 916 (corresponding middle-plunger gate 722 of FIG. 7 and also corresponding to middle-plunger gate 822 of FIG. 8)

formed over dielectric layer 914. Thus, middle-plunger gate 722 may be formed in a first layer of gates included in topological superconductor device 700. Middle-plunger gate 722 may be formed of gold (Au) or a titanium-gold (Ti—Au) alloy. Another dielectric layer 918 is shown as formed over middle-plunger gate 722. Dielectric layer 918 may also be formed as an oxide layer (e.g., hafnium oxide or aluminum oxide) or using another appropriate dielectric layer material. Although cross-section view 900 of FIG. 9 shows a certain number of layers arranged in a certain order, topological superconductor device 700 of FIG. 7 may include additional or fewer layers, arranged differently.

The design parameters associated with topological superconductor device 700 of FIG. 7 may be similar to the ones as described with respect to FIG. 4, including parameters such as plunger separation, plunger setback, plunger taper, helper setback, and helper taper. Each of these design parameters can be selected to optimize the performance of the topological superconductor device.

The use of gates that are formed in two different layers of topological superconductor device 700 of FIG. 7 creates several benefits that are similar to the ones described earlier with respect to topological superconductor device 100 of FIG. 1. First, the crosstalk among gates is reduced because certain gates are formed in one layer of the topological superconductor device while certain other gates are formed in a different layer of the topological superconductor device. Second, the optimization of the design parameters for the topological superconductor device ensures that there are no wire regions with unwanted resonances. In other words, there is a smooth monotonic response of the local conductance to the gate voltages. A third benefit of the use of gates that are formed in two different layers of the topological superconductor device is the robustness of this design to misalignment among structures during fabrication. Specifically, the misalignment of the plunger gates relative to the superconducting wire as explained earlier.

In conclusion, the present disclosure relates to a topological superconductor device comprising a superconducting wire having a first junction near a first end of the superconducting wire and a second junction near a second end, opposite to the first end, of the superconducting wire. The topological superconductor device may further include a first side-plunger gate formed in a first gate layer of the topological superconductor device, where the first side-plunger gate is operable to tune a first section of the superconducting wire located between the first junction and the first end of the superconducting wire. The topological superconductor device may further include a second side-plunger gate formed in the first gate layer of the topological superconductor device, where the second side-plunger gate is operable to tune a second section of the superconducting wire located between the second junction and the second end of the superconducting wire.

The topological superconductor device may further include a middle-plunger gate formed in the first gate layer of the topological superconductor device, where the middle-plunger gate is operable to tune a middle section of the superconducting wire located between the first junction and the second junction. The topological superconductor device may further include a first cutter gate formed in a second layer, different from the first layer, of the topological superconductor device, where the first cutter gate is operable to open and close the first junction. The topological superconductor device may further include a second cutter gate formed in the second layer of the topological superconductor device, where the second cutter gate is operable to open and close the second junction.

The first side-plunger gate may be operable to tune the first section of the superconducting wire into a trivial phase. The second side-plunger gate may be operable to tune the second section of the superconducting wire into the trivial phase. The middle-plunger gate may be operable to tune the middle section of the superconducting wire into a topological phase.

The superconducting wire may be patterned on a two-dimensional electron gas (2DEG). The topological superconductor device may further include a first helper gate formed in the first layer of the topological superconductor device, where the first helper gate is operable to control a density of electrons in a first region of the 2DEG. The topological superconductor device may further include a second helper gate formed in the first layer of the topological superconductor device, where the second helper gate is operable to control a density of electrons in a second region, different from the first region, of the 2DEG.

In another example, the present disclosure relates to a method for forming a topological superconductor device. The method may include forming a superconducting wire having a first junction near a first end of the superconducting wire and a second junction near a second end, opposite to the first end, of the superconducting wire. The method may further include forming a first side-plunger gate in a first gate layer of the topological superconductor device, where the first side-plunger gate is operable to tune a first section of the superconducting wire located between the first junction and the first end of the superconducting wire. The method may further include forming a second side-plunger gate in the first gate layer of the topological superconductor device, where the second side-plunger gate is operable to tune a second section of the superconducting wire located between the second junction and the second end of the superconducting wire. The method may further include forming a middle-plunger gate in the first gate layer of the topological superconductor device, where the middle-plunger gate is operable to tune a middle section of the superconducting wire located between the first junction and the second junction.

The method may further include forming a first cutter gate in a second layer, different from the first layer, of the topological superconductor device, where the first cutter gate is operable to open and close the first junction. The method may further include forming a second cutter gate in the second layer of the topological superconductor device, where the second cutter gate is operable to open and close the second junction.

The first side-plunger gate may be operable to tune the first section of the superconducting wire into a trivial phase. The second side-plunger gate may be operable to tune the second section of the superconducting wire into the trivial phase. The middle-plunger gate may be operable to tune the middle section of the superconducting wire into a topological phase.

Forming the superconducting wire comprises patterning the superconducting wire on a two-dimensional electron gas (2DEG). The method may further include forming a first helper gate in the first layer of the topological superconductor device, where the first helper gate is operable to control a density of electrons in a first region of the 2DEG. The method may further include forming a second helper gate in the first layer of the topological superconductor device, where the second helper gate is operable to control a density of electrons in a second region, different from the first region, of the 2DEG.

In a yet another example, the present disclosure relates to a topological superconductor device comprising a superconducting wire having a first junction near a first end of the superconducting wire and a second junction near a second end, opposite to the first end, of the superconducting wire, where the superconducting wire is patterned on a two-dimensional electron gas (2DEG). The topological superconductor device may further include a left-plunger gate formed in a first gate layer of the topological superconductor device, where the left-plunger gate is operable to tune a first section of the superconducting wire located between the first junction and the first end of the superconducting wire. The topological superconductor device may further include a right-plunger gate formed in the first gate layer of the topological superconductor device, where the right-plunger gate is operable to tune a second section of the superconducting wire located between the second junction and the second end of the superconducting wire. The topological superconductor device may further include a middle-plunger gate formed in the first gate layer of the topological superconductor device, where the middle-plunger gate is operable to tune a middle section of the superconducting wire located between the first junction and the second junction.

The topological superconductor device may further include a left-cutter gate formed in a second layer, different from the first layer, of the topological superconductor device, where the left-cutter gate is operable to open and close the first junction. The topological superconductor device may further include a right-cutter gate formed in the second layer of the topological superconductor device, where the right-cutter gate is operable to open and close the second junction. The topological superconductor device may further include a first helper gate formed in the first layer of the topological superconductor device, where the first helper gate is operable to control a density of electrons in a first region of the 2DEG. The topological superconductor device may further include a second helper gate formed in the first layer of the topological superconductor device, where the second helper gate is operable to control a density of electrons in a second region, different from the first region, of the 2DEG.

The left-plunger gate may be operable to tune the first section of the superconducting wire into a trivial phase. The right-plunger gate may be operable to tune the second section of the superconducting wire into the trivial phase. The middle-plunger gate may be operable to tune the middle section of the superconducting wire into a topological phase.

Each of the left-plunger gate, the right-plunger gate, and the middle-plunger gate may further be configurable to deplete the 2DEG to help define a one-dimensional conducting channel. The topological superconductor device may further include a dielectric layer formed over the superconducting wire and under the first gate layer.

It is to be understood that the systems, devices, methods, and components described herein are merely examples. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality. Merely because a component, which may be an apparatus, a structure, a device, a system, or any other implementation of a functionality, is described herein as being coupled to another component does not mean that the components are necessarily separate components. As an example, a component A described as being coupled to another component B may be a sub-component of the component B, the component B may be a sub-component of the component A, or components A and B may be a combined sub-component of another component C.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A topological superconductor device comprising:

a superconducting wire having a first junction near a first end of the superconducting wire and a second junction near a second end, opposite to the first end, of the superconducting wire, wherein the superconducting wire is patterned on a two-dimensional electron gas (2DEG);

a first dielectric layer formed over the superconducting wire;

a first side-plunger gate formed in a first layer, above the first dielectric layer, of the topological superconductor device, wherein the first side-plunger gate is operable to tune a first section of the superconducting wire located between the first junction and the first end of the superconducting wire;

a second side-plunger gate formed in the first layer of the topological superconductor device, wherein the second side-plunger gate is operable to tune a second section of the superconducting wire located between the second junction and the second end of the superconducting wire;

a middle-plunger gate formed in the first layer of the topological superconductor device, wherein the middle-plunger gate is operable to tune a middle section of the superconducting wire located between the first junction and the second junction;

a first helper gate formed in the first layer of the topological superconductor device, wherein the first helper gate is operable to control a density of electrons in a first region of the 2DEG; and a second helper gate formed in the first layer of the topological superconductor device, wherein the second helper gate is operable to control a density of electrons in a second region, different from the first region, of the 2DEG;

a second dielectric layer formed over each of the first side-plunger gate, the second side-plunger gate, the middle-plunger gate, the first helper gate, and the second helper gate;

a first cutter gate formed in a second layer, above the second dielectric layer, of the topological superconductor device, wherein the first cutter gate is operable to open and close the first junction; and a second cutter gate formed in the second layer of the topological superconductor device, wherein the second cutter gate is operable to open and close the second junction.

2. The topological superconductor device of claim 1, wherein the first side-plunger gate is operable to tune the first section of the superconducting wire into a trivial phase.

3. The topological superconductor device of claim 2, wherein the second side-plunger gate is operable to tune the second section of the superconducting wire into the trivial phase.

4. The topological superconductor device of claim 3, wherein the middle-plunger gate is operable to tune the middle section of the superconducting wire into a topological phase.

5. The topological superconductor device of claim 1, wherein each of the first helper gate and the second helper gate is tapered.

6. The topological superconductor device of claim 5, wherein each of the first helper gate and the second helper gate is separated by a selected amount of separation from the superconducting wire.

7. The topological superconductor device of claim 1, wherein each of the first side-plunger gate, the second side-plunger gate, and the middle-plunger gate is further configurable to deplete the 2DEG to help define a one-dimensional conducting channel.

8. A method for forming a topological superconductor device, the method comprising:

forming a superconducting wire having a first junction near a first end of the superconducting wire and a second junction near a second end, opposite to the first end, of the superconducting wire, wherein forming the superconducting wire comprises patterning the superconducting wire on a two-dimensional electron gas (2DEG);

forming a first dielectric layer over the superconducting wire;

forming a first side-plunger gate in a first layer, above the first dielectric layer, of the topological superconductor device, wherein the first side-plunger gate is operable to tune a first section of the superconducting wire located between the first junction and the first end of the superconducting wire;

forming a second side-plunger gate in the first layer of the topological superconductor device, wherein the second side-plunger gate is operable to tune a second section of the superconducting wire located between the second junction and the second end of the superconducting wire;

forming a middle-plunger gate in the first gate layer of the topological superconductor device, wherein the middle-plunger gate is operable to tune a middle section of the superconducting wire located between the first junction and the second junction;

forming a first helper gate in the first layer of the topological superconductor device, wherein the first helper gate is operable to control a density of electrons in a first region of the 2DEG; and forming a second helper gate in the first layer of the topological superconductor device, wherein the second helper gate is operable to control a density of electrons in a second region, different from the first region, of the 2DEG;

forming a second dielectric layer over each of the first side-plunger gate, the second side-plunger gate, the middle-plunger gate, the first helper gate, and the second helper gate;

forming a first cutter gate in a second layer, above the second dielectric layer, of the topological superconductor device, wherein the first cutter gate is operable to open and close the first junction; and forming a second cutter gate in the second layer of the topological superconductor device, wherein the second cutter gate is operable to open and close the second junction.

9. The method of claim 8, wherein the first side-plunger gate is operable to tune the first section of the superconducting wire into a trivial phase.

10. The method of claim 9, wherein the second side-plunger gate is operable to tune the second section of the superconducting wire into the trivial phase.

11. The method of claim 10, wherein the middle-plunger gate is operable to tune the middle section of the superconducting wire into a topological phase.

12. The method of claim 8, wherein each of the first helper gate and the second helper gate is tapered.

13. The method of claim 12, wherein each of the first helper gate and the second helper gate is separated by a selected amount of separation from the superconducting wire.

14. A topological superconductor device comprising:

a superconducting wire having a first junction near a first end of the superconducting wire and a second junction near a second end, opposite to the first end, of the superconducting wire, wherein the superconducting wire is patterned on a two-dimensional electron gas (2DEG);

a first dielectric layer formed over the superconducting wire;

a left-plunger gate formed in a first layer, above the first dielectric layer, of the topological superconductor device, wherein the left-plunger gate is operable to tune a first section of the superconducting wire located between the first junction and the first end of the superconducting wire;

a right-plunger gate formed in the first layer of the topological superconductor device, wherein the right-plunger gate is operable to tune a second section of the superconducting wire located between the second junction and the second end of the superconducting wire;

a middle-plunger gate formed in the first layer of the topological superconductor device, wherein the middle-plunger gate is operable to tune a middle section of the superconducting wire located between the first junction and the second junction;

a first helper gate formed in the first layer of the topological superconductor device, wherein the first helper gate is operable to control a density of electrons in a first region of the 2DEG; and a second helper gate formed in the first layer of the topological superconductor device, wherein the second helper gate is operable to control a density of electrons in a second region, different from the first region, of the 2DEG;

a second dielectric layer formed over each of the left-plunger gate, the right-plunger gate, the middle-plunger gate, the first helper gate, and the second helper gate;

a left-cutter gate formed in a second layer, above the second dielectric layer, of the topological superconductor device, wherein the left-cutter gate is operable to open and close the first junction; and a right-cutter gate formed in the second layer of the topological superconductor device, wherein the right-cutter gate is operable to open and close the second junction.

15. The topological superconductor device of claim 14, wherein the left-plunger gate is operable to tune the first section of the superconducting wire into a trivial phase.

16. The topological superconductor device of claim 15, wherein the right-plunger gate is operable to tune the second section of the superconducting wire into the trivial phase.

17. The topological superconductor device of claim 16, wherein the middle-plunger gate is operable to tune the middle section of the superconducting wire into a topological phase.

18. The topological superconductor device of claim 14, wherein each of the left-plunger gate, the right-plunger gate, and the middle-plunger gate is further configurable to deplete the 2DEG to help define a one-dimensional conducting channel.

19. The topological superconductor device of claim 16, wherein each of the first helper gate and the second helper gate is tapered.

20. The topological superconductor device of claim 19, wherein each of the first helper gate and the second helper gate is separated by a selected amount of separation from the superconducting wire.

* * * * *